United States Patent [19]

Gronner et al.

[11] 4,270,061

[45] May 26, 1981

[54] CURRENT TRANSFORMER INPUT SYSTEM FOR AC CONVERSION DEVICES

[75] Inventors: Alfred D. Gronner, White Plains, N.Y.; David J. Simon, Saddle Brook, N.J.

[73] Assignee: The Singer Company, Little Falls, N.J.

[21] Appl. No.: 957,525

[22] Filed: Nov. 3, 1978

[51] Int. Cl.[3] .......................... G06G 7/12; H03K 3/26

[52] U.S. Cl. ............................ 307/270; 307/DIG. 1; 307/494; 330/165; 330/188

[58] Field of Search ................. 307/229, 230, DIG. 1, 307/270, 241; 330/165, 167, 188, 196

[56] References Cited

U.S. PATENT DOCUMENTS

| | | | |
|---|---|---|---|
| 3,760,198 | 9/1973 | Mori et al. | 307/230 |
| 4,000,473 | 12/1976 | Saito et al. | 330/167 |

*Primary Examiner*—Stanley D. Miller, Jr.
*Assistant Examiner*—B. P. Davis
*Attorney, Agent, or Firm*—John C. Altmiller; Thomas W. Kennedy

[57] ABSTRACT

An improved input system for isolating resolver or synchro outputs from inputs to demodulators or analog-to-digital converters uses current transformers rather than voltage transformers. The resistances of resistors connected in series with the primary windings of the isolation transformers are adjusted to standardize the input currents of the transformers.

5 Claims, 4 Drawing Figures

CURRENT TRANSFORMER INPUT SYSTEM FOR AC CONVERSION DEVICES

BACKGROUND OF THE INVENTION

This invention relates in general to converters for converting synchro or resolver outputs into digital or dc outputs and more particularly relates to an improved input system of isolation transformers for such converters.

It is frequently necessary to convert the outputs of synchros or resolvers into digital signals or dc outputs. Such conversion can be accomplished by conventional demodulators and analog-to-digital converters. In making this conversion it is desirable to isolate the electronic components of the demodulator and converter from the resolver or synchro output. This elimates undesirable dc biases on the inputs to the demodulator or converter.

Present systems use isolation transformers to accomplish the isolation of the synchro or resolver output from the demodulator or converter input. These systems couple the resolver or synchro outputs directly to the primary windings of the isolation transformers. The voltage drops across the secondary windings, which are proportional to the synchro or resolver output voltages, are used as the inputs to operational amplifiers which apply a scale factor to generate output voltages which are fed to the demodulator or converter.

The isolation transformers used in these systems have many turns of thin wire in the windings. Such transformers are costly and may present reliability problems. These transformers also have special balancing requirements. In addition, the systems are not easily adaptable to different synchro or resolver output voltages. Finally, when these systems are used it is difficult to protect the converter from high voltage spikes.

In accordance with the present invention, the foregoing drawbacks and disadvantages are obviated and an improved system for isolating synchro and resolver outputs from converter and demodulator inputs is provided.

SUMMARY OF THE INVENTION

It is an object of the present invention to provide an input system of isolation transformers which uses less expensive and more reliable transformers than present systems.

It is a further object of the invention to provide an input system of isolation transformers which uses transformers that do not have the special balancing problems of transformers in present systems.

It is another object of the present invention to provide an input system of isolation transformers which can easily be adjusted to accomodate a variety of synchro or resolver output voltages.

It is also an object of the present invention to provide an input system of isolation transformers which allows a demodulator or converter to be easily isolated from the effects of high voltage spikes in the resolver or synchro outputs.

These and other objects of the present invention are achieved by replacing the voltage transformers used in present systems with current transformers. This can be done by placing a resistance in series with the primary windings of each of the isolation transformers. The resistors can be adjusted to limit the current through the primary winding, thereby allowing the input system to be easily adapted to different synchro and resolver output voltages. The current transformers can be made with fewer turns and larger diameter wire in the windings than voltage transformers, thereby allowing the use of less expensive and more reliable transformers. The current transformers do not have the special balancing requirements of voltage transformers. Finally, the use of current transformers in the input systems permits the use of simple diode clamps to isolate the converter from high voltage spikes.

These and other aspects of the invention will be more apparent from the following description of a specific embodiment thereof when considered with the accompanying drawings and appended claims.

BRIEF DESCRIPTION OF THE DRAWINGS

The present invention is illustrated by way of example and not limitation in the figures of the accompanying drawings in which like references indicate similar parts and in which.

DETAILED DESCRIPTION OF THE INVENTION

Figure 1:
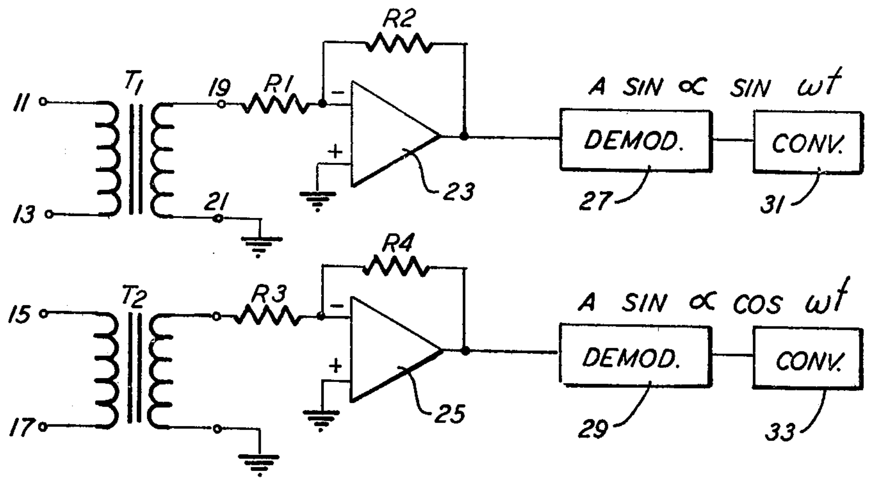
FIG. 1 Prior Art
FIG. 1 is a schematic representation of the use of voltage transformers in an input system intended to isolate resolver outputs from converter or demodulator inputs.

FIG. 1 shows the use of voltage transformers to isolate resolver outputs from demodulator or converter inputs as is conventional. The first resolver output is connected to input terminals 11 and 13 of transformer T1. This first output represents Eo sin $\alpha$ sin $\omega t$, where $\alpha$ is the shaft angle of the resolver, Eo is the maximum output voltage, and $\omega$ is the frequency of a modulating signal (e.g., a 400 hz. signal). The resolver output voltage across the primary winding of transformer T1 induces a voltage across the secondary winding of transformer T1 which appears across terminals 19 and 21. Terminal 19 is connected to one end of resistor R1. The other end of resistor R1 is connected to the inverting input of operational amplifier 23. Feedback resistor R2 is connected across operational amplifier 23. The voltage at the output of operational amplifier 23 is therefore proportional to sin $\alpha$ sin $\omega t$.

The second resolver output, which represents Eo cos $\alpha$ sin $\omega t$ is connected to input terminals 15 and 17 of transformer T2. This output is also modulated, e.g., by a 400 hz. signal. The remainder of the input circuit is the same as the circuit disclosed in connection with the first resolver output. The output of operational amplifier 25 is proportional to cos $\alpha$ sin $\omega t$.

The outputs of operational amplifiers 23 and 25 may be used as inputs to demodulators 27 and 29. The outputs of demodulators 27 and 29 may then be used as inputs to conventional analog-to digital converters 31 and 33.

Transformers T1 and T2 require a high number of turns of thin wire, which makes them costly and not very reliable. Furthermore, there are special balancing requirements for these transformers. In addition, the voltage transformer system is not easily adaptable to different voltages of resolver outputs.

Figure 2:
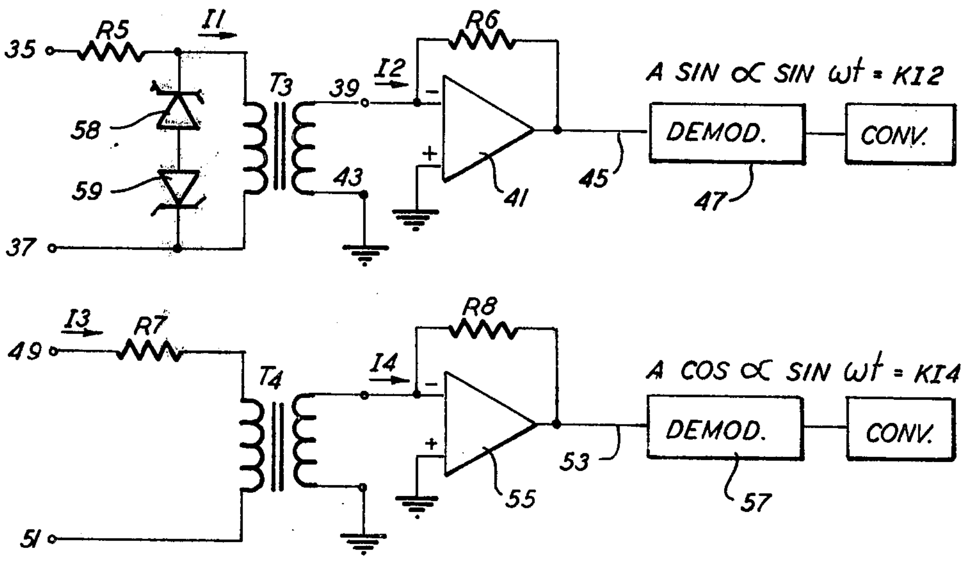
FIG. 2 is a schematic representation of the use of current transformers according to the present invention to isolate resolver outputs from converter or demodulator inputs.

FIG. 2 is a schematic representation of the use of current transformers according to the present invention to isolate resolver outputs from converter or demodulator inputs. Resistor R5 is placed in series with the primary winding of transformer T3. The first resolver output is connected to input terminals 35 and 37. By adjusting the value of resistor R5, the value of current I1 can be standardized to a particular value.

The current I1 in the primary winding of transformer T3 induces a current I2 in the secondary winding of transformer T3. One output terminal 39 of transformer T3 is connected to the inverting input of operational amplifier 41. The other output terminal 43 of transformer T3 is grounded. Feedback resistor R6 is connected across operational amplifier 41. Operational amplifier 41 is a transconductance amplifier, i.e., the voltage Vo at the output 45 of amplifier 41 is proportional to its input current I2. Therefore:

$$Vo = KI2 = A \sin \alpha \sin \omega t$$

Similarly resistor R7 is placed in series with the primary winding of transformer T4 and the second resolver output is connected to input terminals 49 and 51. Current I3 in the primary winding of transformer T4 induces current I4 in the secondary winding of transformer T4. The voltage at the output 53 of operational amplifier 55 is A cos α sin ωt.

This current transformer isolation system for resolver outputs uses transformers having only a few turns of relatively thick wire. These transformers are cheaper and more reliable than the voltage transformers used in system shown in FIG. 1. Resistors R5 and R7 can be easily changed to adapt the input system to different synchro output voltages. For example, assume Eo is 10 volts and R5 and R7 are 10 KΩ. In this case I1 and I3 are 1 ma. If the resolver outputs are changed so that Eo=5 volts, then R5 and R7 are changed to 5 KΩ. Thus I1 and I3 remain at 1 ma.

Finally, simple diode clamps can be used to isolate the demodulator or converter from high voltae spikes, For example, back-to-back zener diodes 58 and 59 can be connected across the primary winding of transformer T3 to isolate demodulator 47 from high voltage spikes at input terminals 35 and 37.

Figure 3:
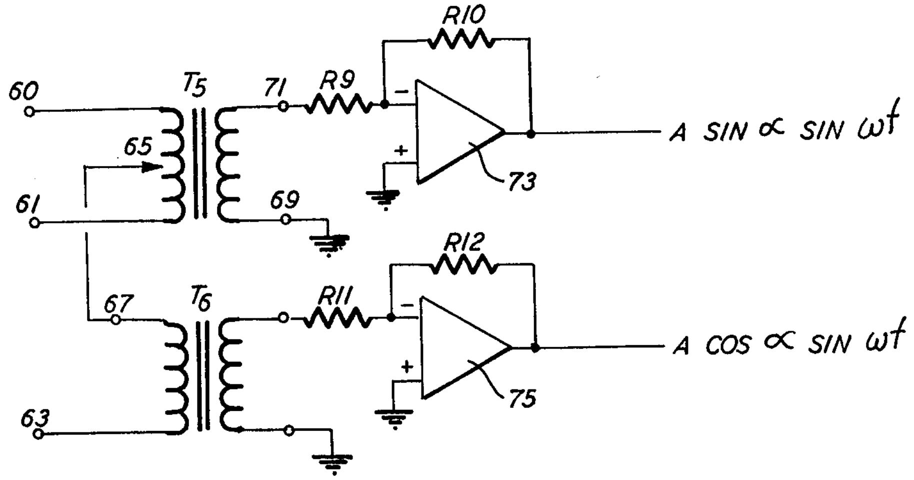
FIG. 3 Prior Art
FIG. 3 is a schematic representation of the use of voltage transformers in an input system intended to isolate synchro outputs from converter or demodulator inputs.

FIG. 3 is a schematic representation of the use of voltage transformers in an input system intended to isolate synchro outputs from converter or demodulator inputs as is conventional. The synchro outputs are connected to input terminals 60, 61 and 63 of transformers T5 and T6. A tap 65 on the primary winding of transformer T5 is connected to terminal 67 on transformer T6. The secondary winding of transformer T5 is grounded at terminal 69 and connected to one end of resistor R9 at terminal 71. The other end of resistor R9 is connected to the inverting input of operational amplifier 73. Feedback resistor R10 is connected across operational amplifier 73. The voltage at the output of operational amplifier 73 is proportional to sin α sin ωt. Similar circuitry connected to the secondary winding of transformer T6 produces a voltage at the output of operational amplifier 75 which is proportional to cos α sin ωt.

This transformer arrangement is a conventional Scott-T transformer system for converting a 3-phase output to a 2-phase output. As with the voltage transformer system shown in FIG. 1, the system illustrated in FIG. 3 requires transformers with a high number of turns of thin wire, thus creating cost and reliability problems. In addition, this system cannot be easily adapted to differing synchro output voltages.

Figure 4:
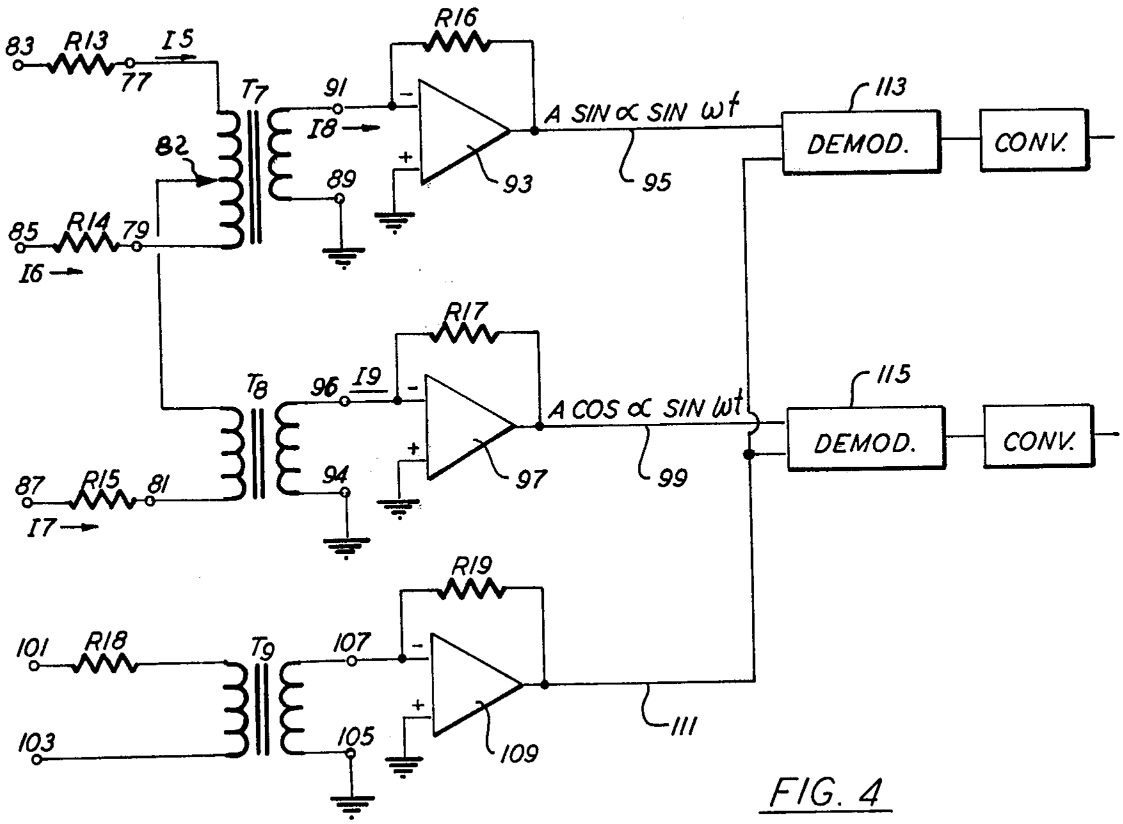
FIG. 4 is a schematic representation of the use of current transformers according to the present invention to isolate synchro outputs from converter or demodulator inputs.

FIG. 4 is a schematic representation of the use of current transformers according to the present invention to isolate synchro outputs from converter or demodulator outputs. Resistors R13, R14 and R15 are attached to the primary windings of transformers T7 and T8 at terminals 77, 79 and 81. One end of the primary winding of transformer T8 is connected to a tap 82 on the primary winding of transformer T7. The synchro outputs are connected to terminals 83, 85 and 87. The secondary winding of transformer T7 is attached to ground at terminal 89 and is attached at terminal 91 to the inverting input of operational amplifier 93. Feedback resistor R16 is attached across operational amplifier 93. Amplifier 93 is a transconductance amplifier and therefore the output voltage 95 of amplifier 93 is:

$$KI8 = A \sin \alpha \sin \omega t$$

The secondary winding of transformer T8 is connected to ground at terminal 94 and attached at terminal 96 to the inverting input of operational amplifier 97. Feedback resistor R17 is attached across operational amplifier 97. Amplifier 97 is a transconductance amplifier and therefore the output voltage 99 of amplifier 97 is:

$$KI9 = A \cos \alpha \sin \omega t$$

As with the current transformer isolation system for resolver outputs, the current transformer system for isolation of synchro outputs uses transformers that have only a few turns of relatively thick wire. Such transformers are cheaper and more reliable than the voltage transformers used in the system shown in FIG. 3. Resistors R13, R14 and R15 can easily be changed to adapt the input system to different synchro output voltages. Finally, simple diode clamps can be used to isolate the demodulator or converter from high voltage spikes.

In some systems it may be necessary to supply a reference voltage Eo' sin ωt to the demodulator or converter, where Eo' has a known relationship to Eo, the maximum voltage at the resolver or synchro outputs. According to the present invention a current transformer is used to isolate the reference output from the demodulator inputs. As shown in FIG. 4, resistor R18 is connected in series with the primary winding of transformer T9. The reference voltage is applied at terminals 101 and 103. The secondary winding of transformer T9 is grounded at terminal 105 and connected at terminal 107 to the inverting input of operational amplifier 109. Feedback resistor R19 is connected from output 111 to the inverting input of amplifier 109. Amplifier 109 is a transconductance amplifier, so that the voltage at the output 111 of amplifier 109 is proportional to the input current. The output 111 of amplifier 109 is fed to demodulators 113 and 115.

The advantages of the present invention, as well as certain changes and modifications of the disclosed embodiment thereof, will be readily apparent to those skilled in the art. It is the applicant's intention to cover by his claims all those changes and modifications which could be made to the embodiment of the invention herein chosen for the purpose of the disclosure without departing from the spirit and scope of the invention.

What is claimed is:

1. An input system for isolating sine and cosine resolver outputs from converter or demodulator inputs which comprises:

a first current transformer having a primary winding and a secondary winding;

a first resistor adapted to be connected between the sine resolver output and the primary winding of the first transformer;

a first operational amplifier having an inverting input directly connected to the secondary winding of the first transformer and having an output voltage proportional to the current at its inverting input;

a first feedback resistor connected to the output and the inverting input of the first operational amplifier;

a second current transformer having a primary winding and a secondary winding;

a second resistor adapted to be connected between the cosine resolver output and the primary winding of the second transformer;

a second operational amplifier having an inverting input directly connected to the secondary winding of the first transformer and having an output voltage proportional to the current at its inverting input; and a second feedback resistor connected to the output and the inverting input of the second operational amplifier.

2. The input system of claim 1, wherein values of said first and second resistors are selected so that the value of the currents in the primary windings of the first and second transformers has a standard value for the maximum voltage of the sine and cosine resolver outputs.

3. An input system for isolating synchro outputs from a converter or demodulator input which comprises:

a first current transformer having a primary winding with a tap thereon and a secondary winding;

a first resistor connected between the first synchro output and one end of the primary winding of the first transformer;

a second resistor connected between the second synchro output and the other end of the primary winding;

a first operational amplifier having an inverting input which is connected to the secondary winding of the first transformer and having an output voltage proportional to the current at its inverting input;

a first feedback resistor connected to the output and the inverting input of the first operational amplifier;

a second current transformer having a primary winding with one end connected to the tap on the primary winding of the first transformer and having a secondary winding;

a third resistor connected between the third synchro output and the other end of the primary winding of the second transformer;

a second operational amplifier having an inverting input connected to the secondary winding of the second transformer and having an output voltage proportional to the current at its inverting input; and a second feedback resistor attached to the output and the inverting input of the second operational amplifier.

4. The input system of claim 3, wherein the values of said first, second and third resistors are selected so that the value of the current in the primary windings of the transformers has a standard value at the maximum voltage of the synchro outputs.

5. The input system of claim 3 for isolating synchro outputs including a reference voltage output from a converter or demodulator input, which further comprises:

a third current transformer having a primary winding and a secondary winding;

a fourth resistor connected between the reference voltage output and the primary winding of the third transformer;

a third operational amplifier having an inverting input connected to the secondary winding of the third transformer and having an output voltage proportional to the current at its inverting input; and a third feedback resistor connected to the output and the inverting input of the third operational amplifier whereby the output of said third operational amplifier can be fed as an isolated reference voltage to a demodulator.

* * * * *